US009214287B2

(12) United States Patent
Imawaka et al.

(10) Patent No.: US 9,214,287 B2
(45) Date of Patent: Dec. 15, 2015

(54) DYE-SENSITIZED SOLAR CELL AND METHOD FOR PREVENTING ELUTION OF CATALYST FROM CATALYST ELECTRODE

(71) Applicant: SHIMANE PREFECTURAL GOVERNMENT, Matsue-Shi, Shimane (JP)

(72) Inventors: Naoto Imawaka, Matsue (JP); Kazuhiko Matsubayashi, Matsue (JP)

(73) Assignee: SHIMANE PERFECTUAL GOVERNMENT, Matsue-shi, Shimane (JP)

( * ) Notice: Subject to any disclaimer, the term of this patent is extended or adjusted under 35 U.S.C. 154(b) by 0 days.

(21) Appl. No.: 14/626,729

(22) Filed: Feb. 19, 2015

(65) Prior Publication Data

US 2015/0179351 A1   Jun. 25, 2015

Related U.S. Application Data

(62) Division of application No. 13/812,478, filed as application No. PCT/JP2011/004120 on Jul. 21, 2011, now Pat. No. 8,993,880.

(30) Foreign Application Priority Data

Jul. 27, 2010   (JP) .................................. 2010-168415

(51) Int. Cl.
*H01L 51/46* (2006.01)
*H01G 9/20* (2006.01)
(Continued)

(52) U.S. Cl.
CPC ........... *H01G 9/2022* (2013.01); *H01G 9/2059* (2013.01); *H01L 51/0001* (2013.01);
(Continued)

(58) Field of Classification Search
CPC . H01G 9/2022; H01G 9/2013; H01G 9/2031; H01G 9/2059; H01L 51/0001; H01L 51/448; H01L 51/0068; H01L 51/0072

USPC ......................................................... 136/263
See application file for complete search history.

(56) References Cited

U.S. PATENT DOCUMENTS 8,257,615 B2 *   9/2012   Matsui ................. H01G 9/2013
                                                      252/500
2007/0289628 A1   12/2007   Sohn et al.
(Continued)

FOREIGN PATENT DOCUMENTS

| CN | 101093876 | 12/2007 |
|---|---|---|
| EP | 1107333 | 6/2001 |

(Continued)

OTHER PUBLICATIONS

E. Olsen, et al., Solar Energy Mater. Solar Cells, 63, 267 (2000).
(Continued)

*Primary Examiner* — Jayne Mershon
(74) *Attorney, Agent, or Firm* — Workman Nydegger

(57) ABSTRACT

Providing a dye-sensitized solar cell having high durability and thermal resistance, and preventing elution of a platinum group catalyst from a catalytic electrode: by surface-treating the catalytic electrode with (a) a specific sulfur material having a molecular weight of 32 to 10,000 containing a sulfur atom having an oxidation number of −2 to 0, (b) another specific sulfur material containing no sulfur atom having an oxidation number of −2 to 0, but containing a sulfur atom having an oxidation number of +1 to +4 [with the proviso that the sulfur material (b) is such a material that a surface of the surface-treated catalyst electrode has a photoelectron peak within a binding energy range of 161 to 165 eV in an X-ray photoelectron spectrum], or (c) a mixture of the sulfur materials (a) and (b); and/or by adding the sulfur material into the electrolyte layer.

4 Claims, 10 Drawing Sheets

(51) Int. Cl.
*H01L 51/00* (2006.01)
*H01L 51/44* (2006.01)

(52) U.S. Cl.
CPC ............ *H01L51/448* (2013.01); *H01G 9/2013* (2013.01); *H01G 9/2031* (2013.01); *H01L 51/0068* (2013.01); *H01L 51/0072* (2013.01); *Y02E 10/542* (2013.01); *Y10T 156/10* (2015.01)

(56) References Cited

U.S. PATENT DOCUMENTS

| | | |
|---|---|---|
| 2009/0107552 A1 | 4/2009 | Minns et al. |
| 2010/0233531 A1 | 9/2010 | Matsui et al. |
| 2013/0125979 A1 | 5/2013 | Imawaka et al. |

FOREIGN PATENT DOCUMENTS

| | | |
|---|---|---|
| JP | 2001-230435 | 8/2001 |
| JP | 2004-146421 | 5/2004 |
| JP | 2006-147412 | 6/2006 |
| JP | 2006-318770 | 11/2006 |
| JP | 2008-004550 | 1/2008 |
| JP | 2008-266744 | 11/2008 |
| JP | 2009-016273 | 1/2009 |
| JP | 2010-251310 | 11/2010 |
| WO | 2009/017298 | 2/2009 |
| WO | 2009/069757 | 6/2009 |
| WO | 2012014414 | 2/2012 |

OTHER PUBLICATIONS

C. Zhang et al., J. Phys. Chem. B 2006, 110, 12485-12489.
N. Kopidakis et al., J. Phys. Chem. C 2009, 113, 21779-21783.
R&D Review of Toyota CRDL, vol. 35, No. 4, pp. 43-50 (Dec. 2000).
M. Graetzel et al., Chem. Mater., 2004, 16, 2694-2696.
International Search Report in corresponding App No. PCT/JP2011/004120 dated Oct. 25, 2011.
Office Action in corresponding Japanese Patent Application No. 2013-050797 dated Feb. 25, 2014.
Office Action in corresponding Chinese Patent Application No. 201180037118.6 dated Nov. 15, 2014.

\* cited by examiner

DYE-SENSITIZED SOLAR CELL AND METHOD FOR PREVENTING ELUTION OF CATALYST FROM CATALYST ELECTRODE

CROSS REFERENCES TO RELATED APPLICATIONS

This application is a divisional application of U.S. patent application Ser. No. 13/812,478 filed on Jan. 25, 2013, which claims priority to PCT Application No. PCT/JP2011/004120, filed on Jul. 21, 2011, which claims priority to Japanese Application No. JP 2010-168415, filed on Jul. 27, 2010, the contents of which are incorporated herein by specific reference.

TECHNICAL FIELD

The present invention relates to a dye-sensitized solar cell having high durability and thermal resistance, particularly to a technology for preventing elution of a catalyst from a catalyst electrode.

BACKGROUND ART

Typical examples of a catalyst electrode (counter electrode) used in a dye-sensitized solar cell are platinum electrodes in which chloroplatinic acid is applied to and heated on an electrode substrate, and in which platinum is vapor-deposited or electro-deposited on an electrode substrate. In addition, an $I_2/I_3^-$ based redox system, which demonstrates well-balanced performances, is a typical example of an electrolyte used in a dye-sensitized solar cell.

However, a problem has been reported that platinum serving as a catalyst is dissolved in an electrolyte solution having an $I_2/I_3^-$ based redox system or similar system (see NPL 1, paragraph 0004 and so forth of PTL 1).

Several techniques for addressing such a problem are reported.

For example, PTL 1 discloses an electrode including a n-conjugated conductive polymer layer formed as a corrosion-resistant conductive coating material on an intermediate layer made of a platinum group metal layer and/or an oxide layer thereof formed on a substrate. As the corrosion-resistant conductive coating material, polypyrrole, polyaniline, polythiophene, or derivatives thereof are exemplified.

Moreover, PTL 2 filed by the same applicant as PTL 1 above discloses, as a highly corrosion-resistant catalyst electrode, a catalyst electrode having a corrosion-resistant conductive layer on a metal layer on a catalyst electrode. As the material for forming the corrosion-resistant conductive layer, various metal oxides, metal nitrides, and metal borides are exemplified.

Further, PTL 3 mainly targets a fuel cell, and does not mention a dye-sensitized type solar cell, but states that elution of platinum can be prevented by supplying a reactive gas containing a heterocyclic compound, for example, pyridines such as bipyridine, terpyridine, and phenanthroline to an electrochemical cell to bring the reactive gas into contact with a platinum-containing electrode catalyst layer in the electrochemical cell.

Furthermore, PTL 4 can be cited as an example similar to PTL 1 above in terms of materials for an electrode, even though PTL 4 does not particularly mention the durability and thermal resistance of an electrode. PTL 4 discloses an electrode in which a conductive layer containing platinum particles and a conductive binder for binding the platinum particles is formed on a substrate and the voids in communicating with a surface of the conductive layer are formed among the platinum particles, especially in order to surely obtain a large surface area for the electrode surface. As the conductive binder, polythiophene such as poly(3,4-ethylenedioxythiophene), polypyrrole, and polyaniline are exemplified.

CITATION LIST

Patent Literatures

PTL 1: Japanese Patent Laid-Open No. 2008-266744
PTL 2: Japanese Patent Laid-Open No. 2006-318770
PTL 3: Japanese Patent Laid-Open No. 2009-016273
PTL 4: Japanese Patent Laid-Open No. 2006-147412

Non Patent Literatures

NPL 1: E. Olsten, et al., Solar Energy Mater. Solar Cells, 63, 267 (2000)
NPL 2: C. Zhang et al., J. Phys. Chem. B 2006, 110, 12485-12489
NPL 3: N. Kopidakis et al., J. Phys. Chem. C 2009, 113, 21779-21783
NPL 4: R&D Review of Toyota CRDL, vol. 35, No. 4, pp. 43-50 (2000, 12)
NPL 5: M. Graetzel et al., Chem. Mater., 2004, 16, 2694-2696

SUMMARY OF INVENTION

An object of the present invention is to improve the durability and thermal resistance of a dye-sensitized solar cell by preventing elution of a catalyst from a catalyst electrode, and more generally to provide a new method for improving the durability and thermal resistance of a catalyst electrode.

1. The first embodiment of the present invention is a dye-sensitized solar cell characterized in that the dye-sensitized solar cell is a dye-sensitized type solar cell comprising: a semiconductor electrode containing a photo-sensitizing dye; an electrolyte layer containing chemical species as a redox couple; and a counter electrode disposed opposite to the semiconductor electrode with the electrolyte layer interposed therebetween, the counter electrode is a catalyst electrode containing a platinum group, and the catalyst electrode is surface-treated with any one of sulfur materials:

(a) at least one sulfur material having a molecular weight of 32 to 10,000 selected from elemental sulfur, inorganic sulfur compounds each containing at least one sulfur atom having an oxidation number of −2 to 0, and organic sulfur compounds each containing at least one sulfur atom having an oxidation number of −2 to 0;

(b) at least one sulfur material containing no sulfur atom having an oxidation number of −2 to 0 selected from inorganic sulfur compounds each containing at least one sulfur atom having an oxidation number of +1 to +4 and organic sulfur compounds each containing at least one sulfur atom having an oxidation number of +1 to +4; and (c) a mixture of the sulfur materials (a) and (b), with the proviso that the sulfur material (b) is such a material that a surface of the catalyst electrode surface-treated with the sulfur material (b) has a photoelectron peak within a binding energy range of 161 to 165 eV in an X-ray photoelectron spectrum.

2. The second embodiment of the present invention is a dye-sensitized solar cell characterized in that the dye-sensitized solar cell is a dye-sensitized type solar cell comprising: a semiconductor electrode containing a photo-sensitizing dye; an electrolyte layer containing chemical species as a redox couple; and a counter electrode disposed opposite to the semiconductor electrode with the electrolyte layer interposed therebetween, the counter electrode is a catalyst electrode containing a platinum group, and the electrolyte layer contains any one of sulfur materials:

(a) at least one sulfur material having a molecular weight of 32 to 10,000 selected from elemental sulfur, inorganic sulfur compounds each containing at least one sulfur atom having an oxidation number of −2 to 0, and organic sulfur compounds each containing at least one sulfur atom having an oxidation number of −2 to 0;

(b) at least one sulfur material containing no sulfur atom having an oxidation number of −2 to 0 selected from inorganic sulfur compounds each containing at least one sulfur atom having an oxidation number of +1 to +4 and organic sulfur compounds each containing at least one sulfur atom having an oxidation number of +1 to +4; and (c) a mixture of the sulfur materials (a) and (b), with the proviso that:

the sulfur compound (b) is such a material that when the catalyst electrode is surface-treated with the sulfur material (b), the treated surface of the catalyst electrode has a photoelectron peak within a binding energy range of 161 to 165 eV in an X-ray photoelectron spectrum;

when the sulfur material (a) is guanidinium thiocyanate, the guanidinium thiocyanate satisfies a requirement of having a concentration of the guanidinium thiocyanate is less than 0.1 M in the electrolyte layer; and when the sulfur material (a) is 1-ethyl-3-methylimidazolium thiocyanate, a volume percent of the 1-ethyl-3-methylimidazolium thiocyanate is less than 35% by volume in a solvent of an electrolyte solution, where the volume percent of the 1-ethyl-3-methylimidazolium thiocyanate is calculated based on a sum of each volume of a main solvent and one or more cosolvents where the main solvent is a liquid component present in a largest amount (based on the volume of the component present alone) among components in a liquid state at standard ambient temperature and pressure (25° C., 1 atm) of the electrolyte layer, and the one or more cosolvents are 1-ethyl-3-methylimidazolium thiocyanate (ionic liquid) and one or more optional liquid components, each of the optional liquid components having a one-fifth volume or more of the main solvent (based on the volumes of the components each present alone).

3. The third embodiment of the present invention is a dye-sensitized solar cell characterized in that the dye-sensitized solar cell is a dye-sensitized type solar cell comprising: a semiconductor electrode containing a photo-sensitizing dye; an electrolyte layer containing chemical species as a redox couple; and a counter electrode disposed opposite to the semiconductor electrode with the electrolyte layer interposed therebetween, the counter electrode is a catalyst electrode containing a platinum group, the catalyst electrode is surface-treated with any one of first sulfur materials:

(a1) at least one sulfur material having a molecular weight of 32 to 10,000 selected from elemental sulfur, inorganic sulfur compounds each containing at least one sulfur atom having an oxidation number of −2 to 0, and organic sulfur compounds each containing at least one sulfur atom having an oxidation number of −2 to 0;

(b1) at least one sulfur material containing no sulfur atom having an oxidation number of −2 to 0 selected from inorganic sulfur compounds each containing at least one sulfur atom having an oxidation number of +1 to +4 and organic sulfur compounds each containing at least one sulfur atom having an oxidation number of +1 to +4; and (c1) a mixture of the sulfur materials (a1) and (b1), and the electrolyte layer contains any one of second sulfur materials:

(a2) at least one sulfur material having a molecular weight of 32 to 10,000 selected from elemental sulfur, inorganic sulfur compounds each containing at least one sulfur atom having an oxidation number of −2 to 0, and organic sulfur compounds each containing at least one sulfur atom having an oxidation number of −2 to 0;

(b2) at least one sulfur material containing no sulfur atom having an oxidation number of −2 to 0 selected from inorganic sulfur compounds each containing at least one sulfur atom having an oxidation number of +1 to +4 and organic sulfur compounds each containing at least one sulfur atom having an oxidation number of +1 to +4; and (c2) a mixture of the sulfur materials (a2) and (b2), with the proviso that the sulfur material (b1) among the first sulfur materials is such a material that a surface of the catalyst electrode surface-treated with the sulfur material (b1) has a photoelectron peak within a binding energy range of 161 to 165 eV in an X-ray photoelectron spectrum; and the sulfur material (b2) among the second sulfur materials is such a material that when the catalyst electrode is surface-treated with the sulfur material (b2), the treated surface of the catalyst electrode has a photoelectron peak within a binding energy range of 161 to 165 eV in an X-ray photoelectron spectrum.

4. The fourth embodiment of the present invention is a method for preventing elution of a platinum group catalyst from a catalyst electrode having the platinum group catalyst into an electrolyte layer in contact with the catalyst electrode, where the electrolyte layer contains chemical species as a redox couple, the catalyst electrode is surface-treated with any one of first sulfur materials:

(a1) at least one sulfur material having a molecular weight of 32 to 10,000 selected from elemental sulfur, inorganic sulfur compounds each containing at least one sulfur atom having an oxidation number of −2 to 0, and organic sulfur compounds each containing at least one sulfur atom having an oxidation number of −2 to 0;

(b1) at least one sulfur material containing no sulfur atom having an oxidation number of −2 to 0 selected from inorganic sulfur compounds each containing at least one sulfur atom having an oxidation number of +1 to +4 and organic sulfur compounds each containing at least one sulfur atom having an oxidation number of +1 to +4; and (c1) a mixture of the sulfur materials (a1) and (b1), and/or the electrolyte layer contains any one of second sulfur materials:

(a2) at least one sulfur material having a molecular weight of 32 to 10,000 selected from elemental sulfur, inorganic sulfur compounds each containing at least one sulfur atom having an oxidation number of −2 to 0, and organic sulfur compounds each containing at least one sulfur atom having an oxidation number of −2 to 0;

(b2) at least one sulfur material containing no sulfur atom having an oxidation number of −2 to 0 selected from inorganic sulfur compounds each containing at least one sulfur atom having an oxidation number of +1 to +4 and organic sulfur compounds each containing at least one sulfur atom having an oxidation number of +1 to +4; and (c2) a mixture of the sulfur materials (a2) and (b2), with the proviso that the sulfur material (b1) among the first sulfur materials is such a material that a surface of the catalyst electrode surface-treated with the sulfur material (b1) has a photoelectron peak within a binding energy range of 161 to 165 eV in an X-ray photoelectron spectrum; and the sulfur material (b2) is such a material that when the catalyst electrode is surface-treated with the sulfur material (b2), the treated surface of the catalyst electrode has a photoelectron peak within a binding energy range of 161 to 165 eV in an X-ray photoelectron spectrum.

The first embodiment of the present invention makes it possible to prevent elution of a catalyst from the catalyst electrode, accordingly enabling production of a solar cell having high durability and thermal resistance. In addition, at least in a preferred mode of the present invention, the catalytic activity of the catalyst electrode can also be enhanced, thereby improving not only the durability and the thermal resistance but also the photoelectric conversion efficiency of the solar cell.

Moreover, in the second embodiment of the present invention, the means is merely adding a particular sulfur material into the electrolyte solution, and accordingly there are advantages of being very simple, low cost, and capable of improving the durability and the thermal resistance of the catalyst electrode and a cell using the same. Additionally, it can be expected that a sulfur coated film formed on the surface of the catalyst electrode lasts long, the sulfur coated film being believed to contribute to the durability and the thermal resistance.

Further, the third embodiment of the present invention can be expected to have the merits of both of the first embodiment and the second embodiment of the present invention.

DESCRIPTION OF EMBODIMENTS

Figure 1A:
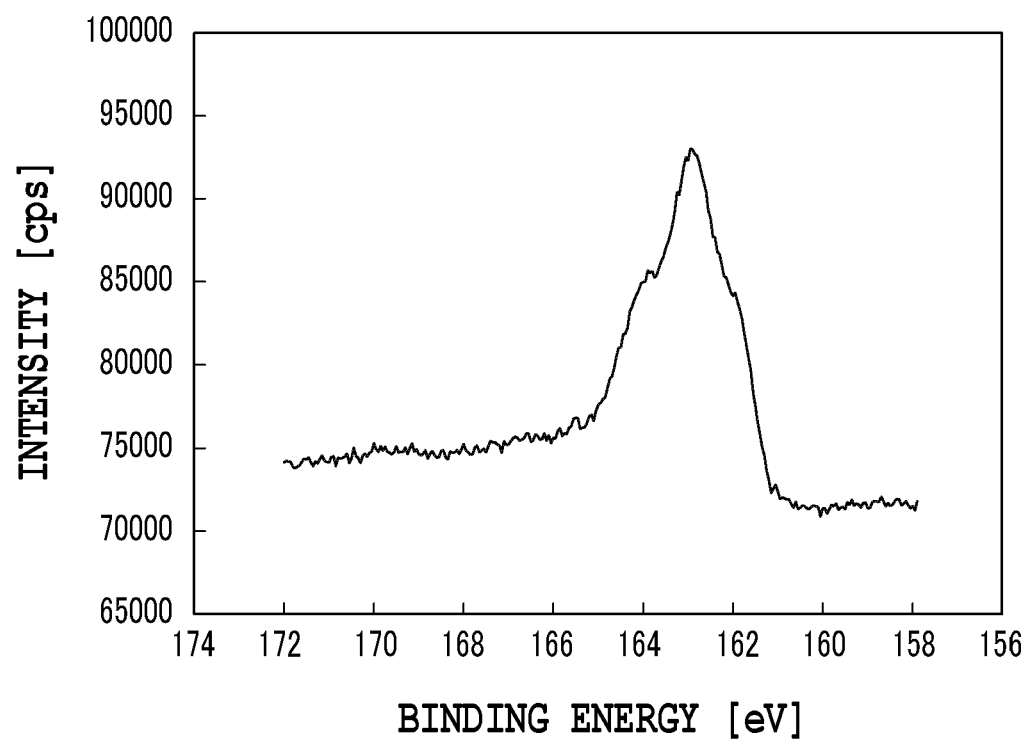
FIG. 1A is a graph showing a photoelectron peak within a S2p region in an X-ray photoelectron spectrum of a surface of a platinum catalyst electrode surface-treated with sodium sulfide.
Figure 1B:
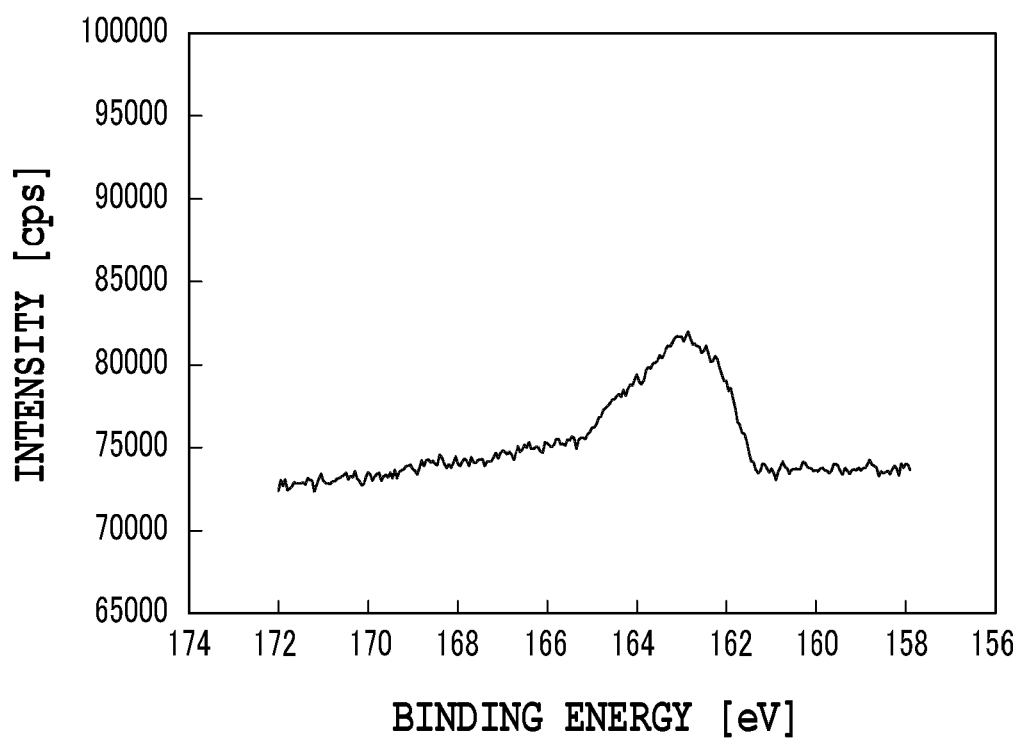
FIG. 1B is a graph showing a photoelectron peak within a S2p region in an X-ray photoelectron spectrum of a surface of a platinum catalyst electrode surface-treated with potassium thiocyanate.
Figure 2A:
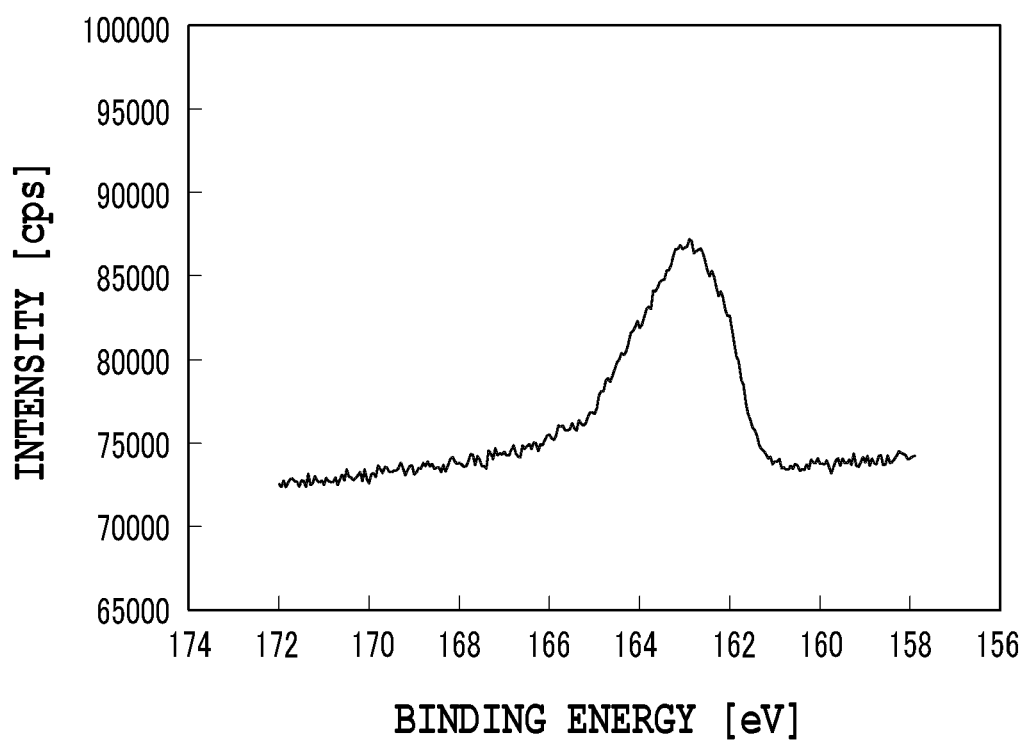
FIG. 2A is a graph showing a photoelectron peak within a S2p region in an X-ray photoelectron spectrum of a surface of a platinum catalyst electrode surface-treated with thiourea.
Figure 2B:
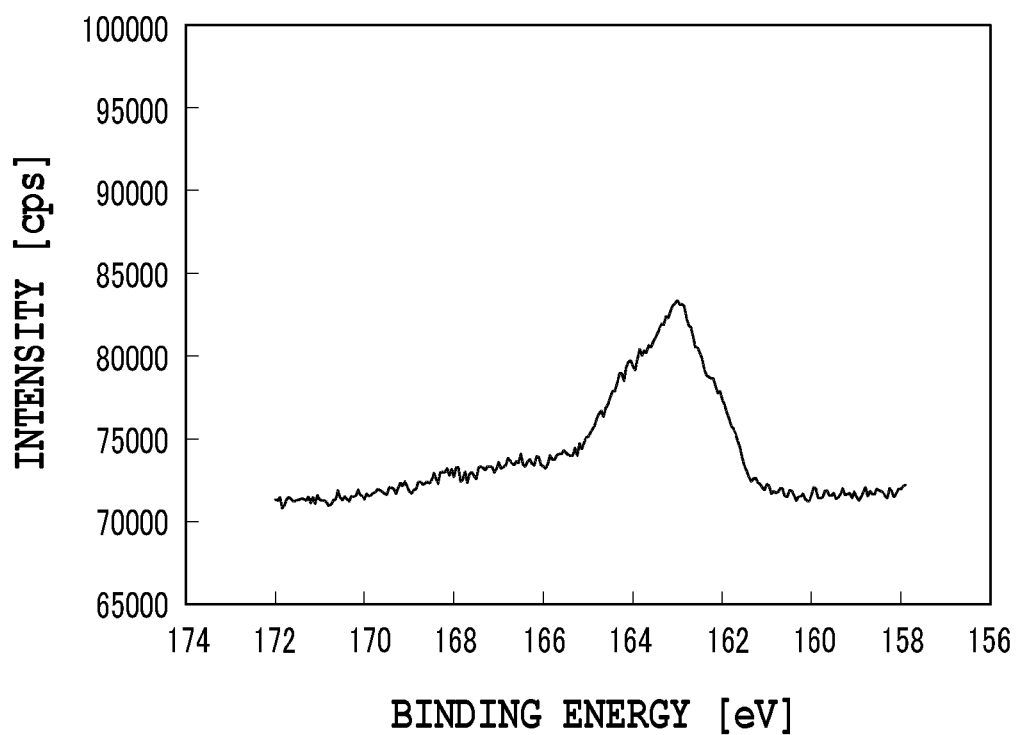
FIG. 2B is a graph showing a photoelectron peak within a S2p region in an X-ray photoelectron spectrum of a surface of a platinum catalyst electrode surface-treated with elemental sulfur.

1. First Embodiment of the Present Invention

In the first embodiment of the present invention, a dye-sensitized type solar cell is characterized in that a catalyst electrode is surface-treated with a particular sulfur material.

In the present invention, an effect of suppressing elution of a catalyst and at least in a preferred mode, an effect of improving the catalytic activity are demonstrated. Although the mechanism is not known in detail, it is speculated that by the contact with such a particular sulfur material, a coated film of a single molecular or single atomic layer containing a sulfur atom in a low oxidation state (having an oxidation number of −2 to 0) is formed on a surface of the metal catalyst, and the sulfur atom creates an reducing environment on the metal catalyst surface. Specifically, the reducing environment presumably suppresses oxidation and dissolution of the catalyst by an oxidizing substance (such as $I_2$) in an electrolyte, and at least in a preferred mode, the bonding or interaction with the sulfur atom changes the electronic state of the metal catalyst, and may also enhance the catalytic activity.

1) Sulfur Material (1) In the present embodiment, the sulfur material refers to any one of sulfur materials:

(a) at least one sulfur material having a molecular weight of 32 to 10,000, more preferably 32 to 5,000, further preferably 32 to 1,000, and still further preferably 32 to 500 selected from elemental sulfur, inorganic sulfur compounds each containing at least one sulfur atom having an oxidation number of −2 to 0, and organic sulfur compounds each containing at least one sulfur atom having an oxidation number of −2 to 0;

(b) at least one sulfur material containing no sulfur atom having an oxidation number of −2 to 0 selected from inorganic sulfur compounds each containing at least one sulfur atom having an oxidation number of +1 to +4, more preferably having an oxidation number of +3 or +4, and organic sulfur compounds each containing at least one sulfur atom having an oxidation number of +1 to +4, more preferably +3 or +4; and (c) a mixture of the sulfur materials (a) and (b).

Nevertheless, it is required that the sulfur material (b) be such a material that the surface of the catalyst electrode surface-treated with the sulfur material (b) has a photoelectron peak within a binding energy range of 161 to 165 eV in an X-ray photoelectron spectrum.

(2) In the present embodiment, the sulfur material (a) contains at least one sulfur atom having an oxidation number of −2 to 0, while the sulfur material (b) contains at least one sulfur atom having an oxidation number of +1 to +4 but does not contain sulfur atoms having an oxidation number of −2 to 0.

The oxidation number is an apparent oxidation state of an element; (i) the oxidation number of each atom in a covalent compound is the resulting formal charge number of the atom, when an electron pair shared between two atoms is all assigned to the more electronegative atom, (ii) the oxidation number of a monatomic ion in an ionic compound is equal to the charge number of the ion, and (iii) the oxidation number of an atom in an elemental form is always 0.

Note that the electronegativity refers to the tendency of an atom to be electrically negative by attracting electrons through the bond. For example, according to the Pauling scale, the values of main elements are as follow:

Element (Electronegativity):

H (2.1), C (2.5), N (3.0), O (3.5), S (2.5).

(3) It is believed that a sulfur coated film in a low oxidation state (having an oxidation number of −2 to 0) is formed on the surface of the catalyst electrode surface-treated with the sulfur material (a). This can be confirmed by a photoelectron peak presumably due to sulfur in a low oxidation state (having an oxidation number of −2 to 0) present within a S2p region (a photoelectron peak region of electrons in 2p orbital of a sulfur atom) of 161 to 165 eV in the X-ray photoelectron spectrum of the surface of the catalyst electrode (see FIGS. 1A, 1B, 2A, 2B, and 3A and NPL 4).

In contrast, it is believed that in the case of the sulfur material (b1), once the sulfur atom having an oxidation number of +1 to +4 is reduced on the surface of the catalyst electrode surface-treated with the sulfur material, a sulfur coated film formed on the surface of the catalyst electrode contains the sulfur atom converted to the same low oxidation state (having an oxidation number of −2 to 0) as that of the sulfur material (a) above. This is speculated because similarly to the case of the sulfur material (a), a photoelectron peak presumably due to sulfur in a low oxidation state (having an oxidation number of −2 to 0) is observed within a S2p region (a photoelectron peak region of electrons in 2p orbital of a sulfur atom) of 161 to 165 eV in an X-ray photoelectron spectroscopy spectrum of a surface of a catalyst electrode treated with sodium dithionite containing a sulfur atom having an oxidation number of +3 or sulfolane containing a sulfur atom having an oxidation number of +4 (see FIGS. 4A and 4B).

Since it is believed that the sulfur atom having an oxidation number of +1 to +4 undergoes a reduction process to be a sulfur atom in the low oxidation state, the sulfur material (b) is required to be such a material that the surface of the catalyst electrode surface-treated with the sulfur material (b) has a photoelectron peak within a binding energy range of 161 to 165 eV in an X-ray photoelectron spectrum.

(4) Elemental sulfur is sulfur present in a free state, such as natural sulfur. Note that since it is in the elemental form, the sulfur has an oxidation number of 0.

(5) Examples of the inorganic sulfur compounds as the sulfur material (a) include the following (i), (ii), and (iii).

(i) Metal sulfide salts, metal salts of hydrogen sulfide, ammonium sulfide salts, primary to quaternary ammonium sulfide salts, ammonium salts of hydrogen sulfide, primary to quaternary ammonium salts of hydrogen sulfide, and hydrogen sulfide.

The metal is preferably an alkali metal or alkaline earth metal.

Examples of primary to quaternary ammoniums include pyridinium, guanidinium, tetrapropylammonium, pyrrolidinium, piperidinium, and the like.

More preferable is one represented by the following formula:

[Chemical Formula 1]

$$M_2S \qquad (I)$$

(where two Ms are the same or different, and are each an alkali metal, ammonium, pyridinium, guanidinium, or hydrogen).

More specifically, sodium sulfide, hydrogen sulfide, and the like can be exemplified.

Note that the sulfur atom in this compound has an oxidation number of −2.

(ii) Thiosulfuric Acid, and Salts and Esters Thereof

Examples of a counter cation in the salts include alkali metals, alkaline earth metals, ammonium, and primary to quaternary ammoniums (pyridinium, guanidinium, tetrapropylammonium, pyrrolidinium, piperidinium, and the like). Although falling into the category of organic compounds, examples of the esters here for convenience include esters from alcohols having 1 to 40, more preferably 1 to 20, and further preferably 1 to 10 total carbon atoms which may have a substituent.

More preferable is the following formula:

[Chemical formula 2]

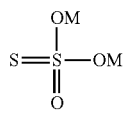

(II)

(where two Ms are the same or different, and are each an alkali metal, ammonium, pyridinium, guanidinium, or a hydrogen ion).

More specifically, sodium thiosulfate can be exemplified.

Note that one sulfur atom of the two sulfur atoms in this compound has an oxidation number of +4, and the other sulfur atom has 0.

(iii) Carbon Sulfide

Examples of carbon sulfide include carbon disulfide, dicarbon trisulfide, carbon monosulfide, and carbon sulfite. An example of sulfur nitride includes tetrasulfur tetranitride.

Sulfur atoms in carbon disulfide, dicarbon trisulfide, carbon monosulfide, and carbon sulfite, all belonging to carbon sulfide have an oxidation number of 0.

(6) Examples of the organic sulfur compounds as the sulfur material (a) include the following (iv) to (vii).

(iv) Organic sulfur compounds having one or more sulfur functional groups selected from a thiol group [—SH] and salts thereof, a hydropolysulfide group [—(S)$_n$SH, where n is an integer of greater than or equal to 1] and salts thereof, a sulfide group [—S—], a polysulfide group [—(S)$_n$S—, where n is an integer of greater than or equal to 1], a thiocarbonyl group [—C(=S)—], a thioaldehyde group [—C(=S)H], a thiocarboxyl group [—C(=S)OH or —C(=O)SH] and salts thereof, and esters, amides, imides, acid anhydrides, and acid halides thereof, a dithiocarboxylic acid [—C(=S)SH] and salts and esters thereof, a thioacetal group, and a thioketal group.

More specifically, typical examples include those represented by the following formulas.

[Chemical formula 3]

$$R^1SH \qquad (III)$$

$$R^1(S)_nSH \qquad (IV)$$

$$R^1SR^2 \qquad (V)$$

$$R^1S(S)_nR^2 \qquad (VI)$$

(VII)

(VIII)

(IX-1)

(IX-2)

(X)

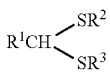
(XI)

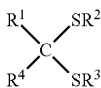
(XII)

(XII-2)

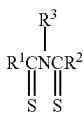
(XII-3)

where $R^1$, $R^2$, $R^3$, and $R^4$ are the same or different, and are each a hydrocarbon group having 1 to 40, more preferably 1 to 20, and further preferably 1 to 10 total carbon atoms which may have a substituent.

Moreover, in the above formulas (V), (VI), (VII), (IX-1), (IX-2), and (X), $R^1$ and $R^2$ may be bonded together to form a ring.

Further, in the above formulas (XI), (XII-2), and (XII-3), $R^1$, $R^2$, and $R^3$ may be bonded together to form a ring. For example, $R^1$ and $R^2$ may be bonded together to form a ring, or three of $R'$, $R^2$, and $R^3$ may be bonded together to form a fused bicyclic ring.

Furthermore, in the formula (XII), $R^1$, $R^2$, $R^3$, and $R^4$ may be bonded together to form a ring. For example, $R^1$ and $R^2$ may be bonded together to form a ring; $R^1$ and R may be bonded together, while $R^3$ and $R^4$ may be bonded together to form a bicyclic ring; $R^1$, $R^2$, and $R^3$ may be bonded together to form a fused bicyclic ring; $R^1$, $R^2$, $R^3$, and $R^4$ may be bonded together to form a fused tricyclic ring.

More specifically, n-dodecanethiol, methionine, triazine trithiol as shown in the following formula (XIII) (2,4,6-trimercapto-s-triazine mono sodium salt), and the like can be exemplified.

[Chemical formula 4]

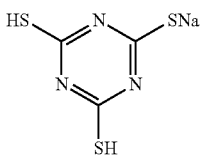
(XIII)

Note that the sulfur atoms in this compound have an oxidation number of −1 or 0.

(v) Thiocyanic acid, salts and esters thereof, and isothiocyanic acid esters.

More specifically, typical examples include those represented by the following formula.

[Chemical Formula 5]

$$R^5SCN \quad (XIV)$$

$$R^6NCS \quad (XV)$$

where $R^5$ and $R^6$ are the same or different, and are each hydrogen, a counter cation, or a hydrocarbon group having 1 to 40, more preferably 1 to 20, and further preferably 1 to 10 total carbon atoms which may have a substituent.

Examples of a counter cation of the thiocyanic acid salts include alkali metal ions, alkaline earth metal ions, an ammonium ion, primary to quaternary ammonium ions, and the like.

More specifically, thiocyanic acid sodium salt, isothiocyanic acid cyclohexyl ester shown in the following formula, and the like can be exemplified.

[Chemical formula 6]

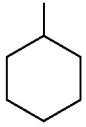
(XVI)

Note that the sulfur atom in this compound has an oxidation number of −1 or 0.

Note that the effects of the present invention are not obtained by isocyanic acid n-hexyl ester containing no sulfur atom, although the ester is similar to the above isothiocyanic acid cyclohexyl ester.

(vi) Thioureas, isothioureas, dithiocarbamic acids, and salts and esters thereof.

More specifically, typical examples include those represented by the following formulas.

[Chemical formula 7]

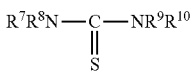
(XVII)

-continued

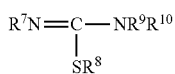

(XVIII)

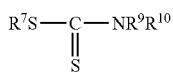

(XIX)

where, $R^7$, $R^8$, $R^9$, and $R^{10}$ are the same or different, and are each a hydrogen atom or a hydrocarbon group having 1 to 40, more preferably 1 to 20, and further preferably 1 to 10 total carbon atoms which may have a substituent.

Moreover, $R^7$, $R^8$, $R^9$, and $R^{10}$ may be bonded together to form a monocyclic or polycyclic ring (including fused rings).

More specifically, thioureas and dithiocarbamic acids as shown in the following formulas can be exemplified.

[Chemical formula 8]

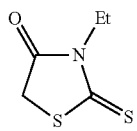

(XX)

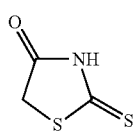

(XXI)

Note that the sulfur atoms in these compounds have an oxidation number of 0.

(vii) Substituted or unsubstituted thiophenes, or substituted or unsubstituted thiazoles.

More specifically, typical examples include those represented by the following formula.

[Chemical formula 9]

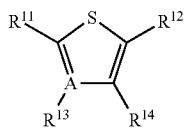

(XXII)

where A is a carbon atom or a nitrogen atom.

Moreover, $R^{11}$, $R^{12}$, and $R^{13}$ (when A is a carbon atom), and $R^{14}$ are the same or different, and are each a hydrogen atom, a hydrocarbon group having 1 to 40, more preferably 1 to 20, and further preferably 1 to 10 total carbon atoms which may have a substituent, or an alkoxy group having 1 to 40, more preferably 1 to 20, and further preferably 1 to 10 total carbon atoms which may have a substituent.

However, when A is a nitrogen atom, $R^{13}$ is an unshared electron pair of the nitrogen atom. When A is a carbon atom, $R^{11}$ and $R^{13}$ may be bonded together to form a ring.

Further, $R^{12}$ and $R^{14}$ may be bonded together to form an alicyclic ring or a benzene ring.

More specifically, thiophene and benzothiazole can be exemplified.

Note that the sulfur atom in each of these compounds has an oxidation number of 0.

Note that the effects of the present invention are not obtained by benzoxazole having a structure equivalent to that of benzothiazole except that a sulfur atom thereof is substituted with an oxygen atom.

(7) Examples of the inorganic sulfur compounds as the sulfur material (b) include dithionous acid ($H_2S_2O_4$) and salts thereof.

Examples of a counter cation in the salts include alkali metals, alkaline earth metals, ammonium, and primary to quaternary ammonium (such as pyridinium, guanidinium, tetrapropylammonium, pyrrolidinium, piperidinium, and the like).

Note that since a dithionite ion is assumed to have the following structure, the sulfur atoms in this compound have an oxidation number of +3.

[Chemical formula 10]

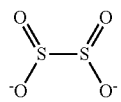

(XXIII)

More specifically, sodium dithionite can be exemplified.

Figure 4A:
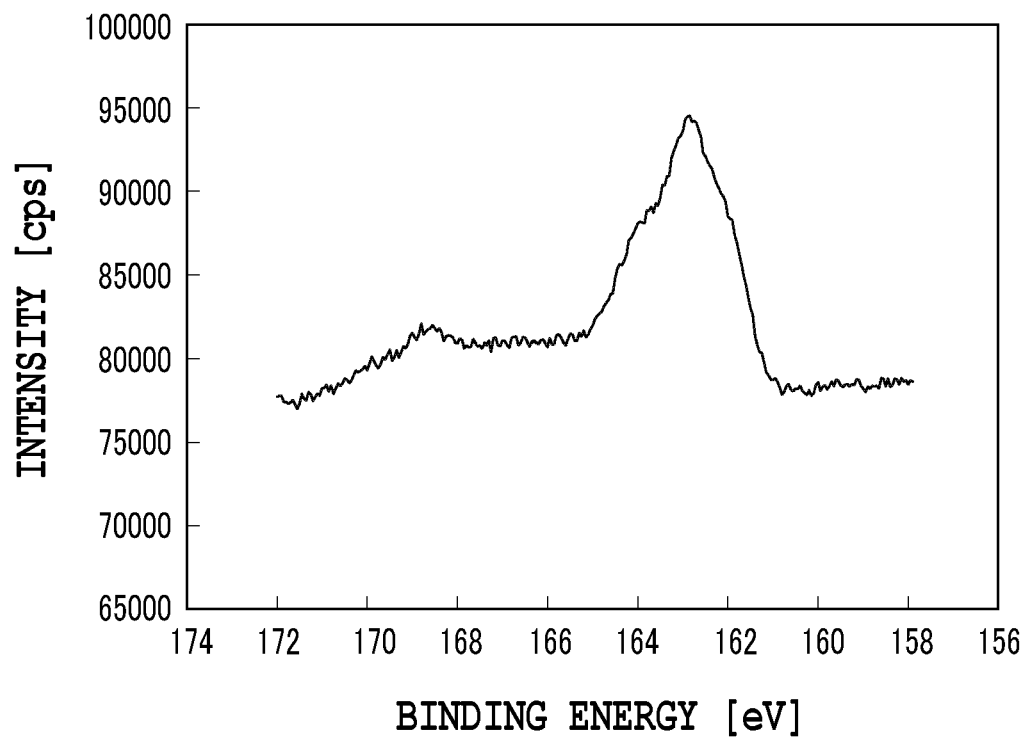
FIG. 4A is a graph showing a photoelectron peak within a S2p region in an X-ray photoelectron spectrum of a surface of a platinum catalyst electrode surface-treated with sodium dithionite.

FIG. 4A shows that when the catalyst electrode is surface-treated with this sulfur material, the treated surface of the catalyst electrode has a photoelectron peak within a binding energy range of 161 to 165 eV in an X-ray photoelectron spectrum.

(8) An example of the organic sulfur compounds as the sulfur material (b) includes a sulfone compound of the following general formula (XXIV). Sulfur in this compound has an oxidation number of +4.

[Chemical formula 11]

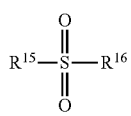

(XXIV)

where $R^{15}$ and $R^{16}$ each independently represent a hydrocarbon group having 1 to 40, more preferably 1 to 20, further preferably 1 to 10, and still further preferably 1 to 4 total carbon atoms which may have a substituent. $R^{15}$ and $R^{16}$ may be bonded together to form a ring.

More specifically, sulfolane [the following formula (XXV)] can be exemplified.

[Chemical formula 12]

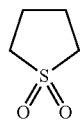

(XXV)

Figure 4B:
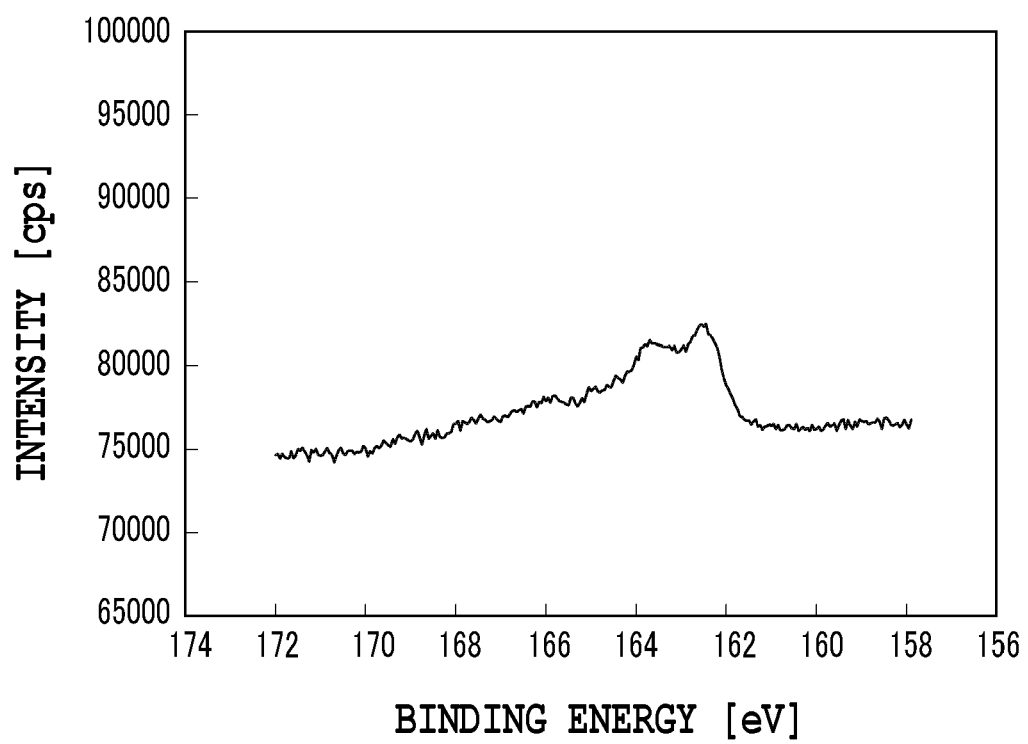
FIG. 4B is a graph showing a photoelectron peak within a S2p region in an X-ray photoelectron spectrum of a surface of a platinum catalyst electrode surface-treated with sulfolane.

As a typical example of the sulfone compound, FIG. 4b shows that when the catalyst electrode is surface-treated with sulfolane, the treated surface of the catalyst electrode has a photoelectron peak within a binding energy range of 161 to 165 eV in an X-ray photoelectron spectrum.

Figure 3A:
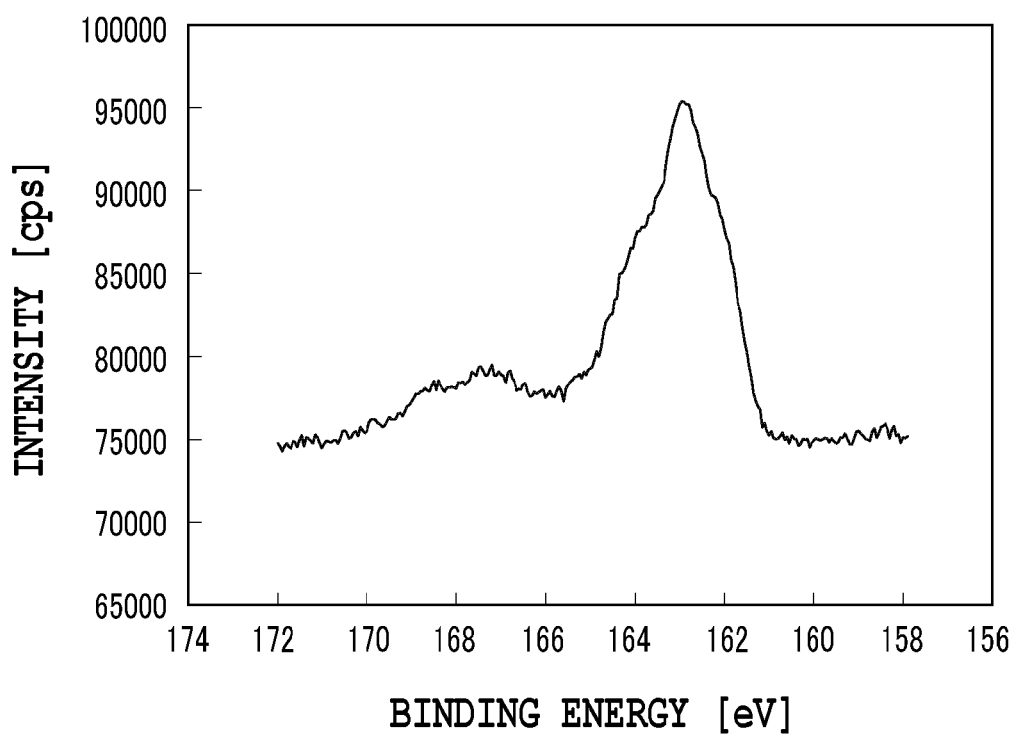
FIG. 3A is a graph showing a photoelectron peak within a S2p region in an X-ray photoelectron spectrum of a surface of a platinum catalyst electrode surface-treated with sodium thiosulfate.
Figure 3B:
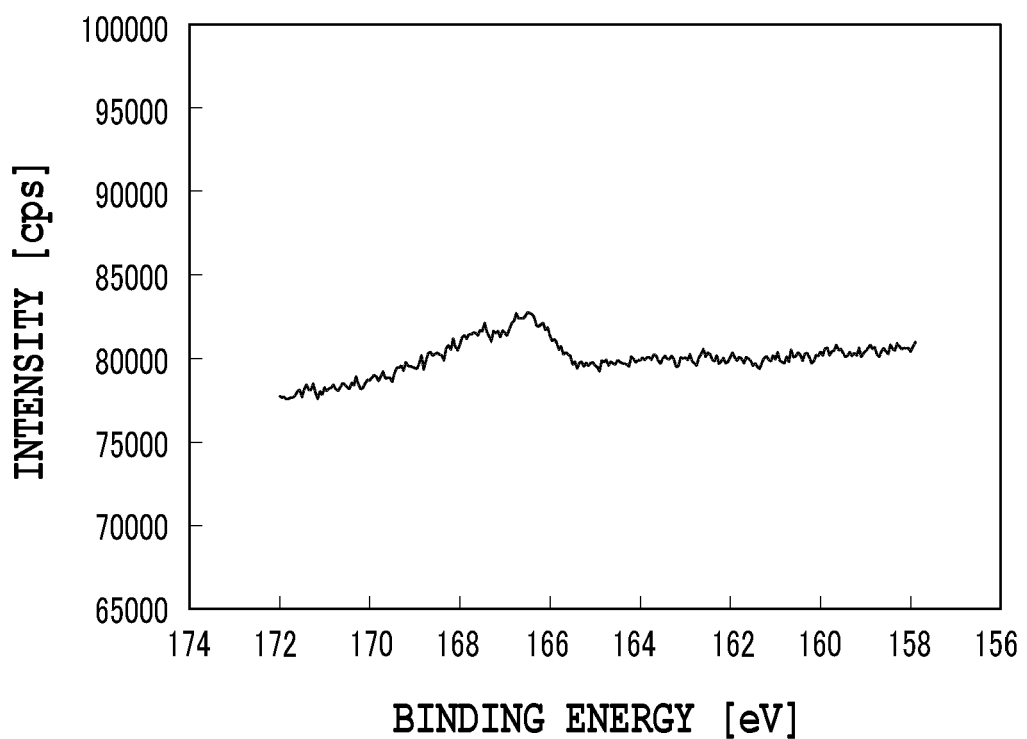
FIG. 3B is a graph showing a photoelectron peak within a S2p region in an X-ray photoelectron spectrum of a surface of a platinum catalyst electrode surface-treated with dimethyl sulfoxide.
Figure 5A:
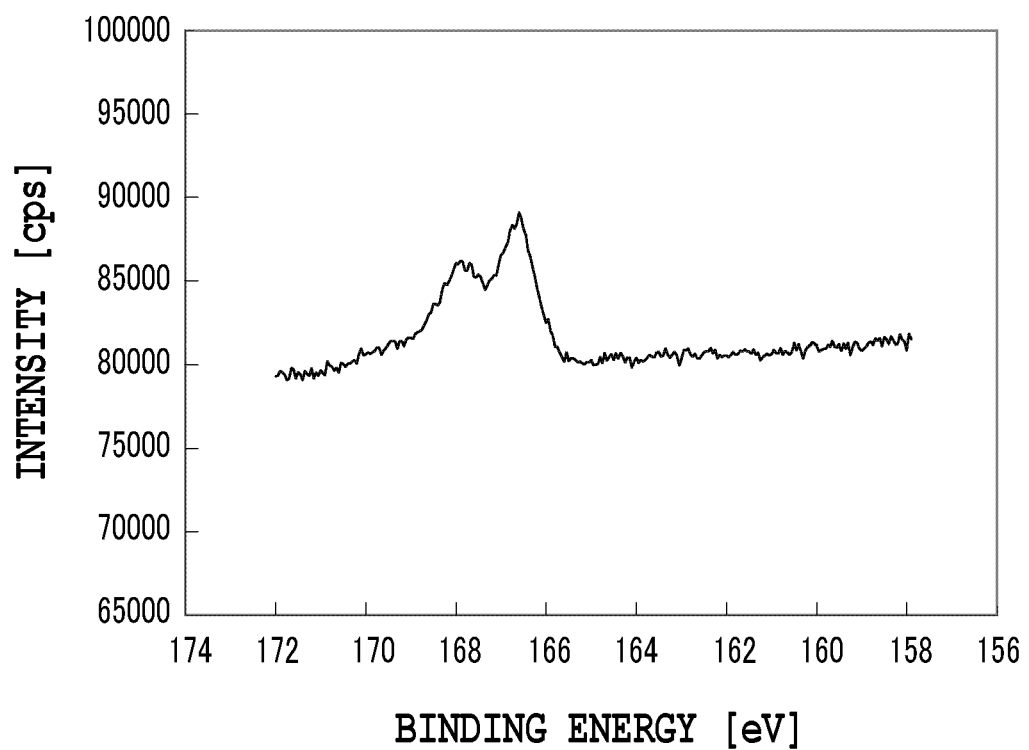
FIG. 5A is a graph showing a photoelectron peak within a S2p region in an X-ray photoelectron spectrum of a surface of a platinum catalyst electrode surface-treated with sodium sulfite.
Figure 5B:
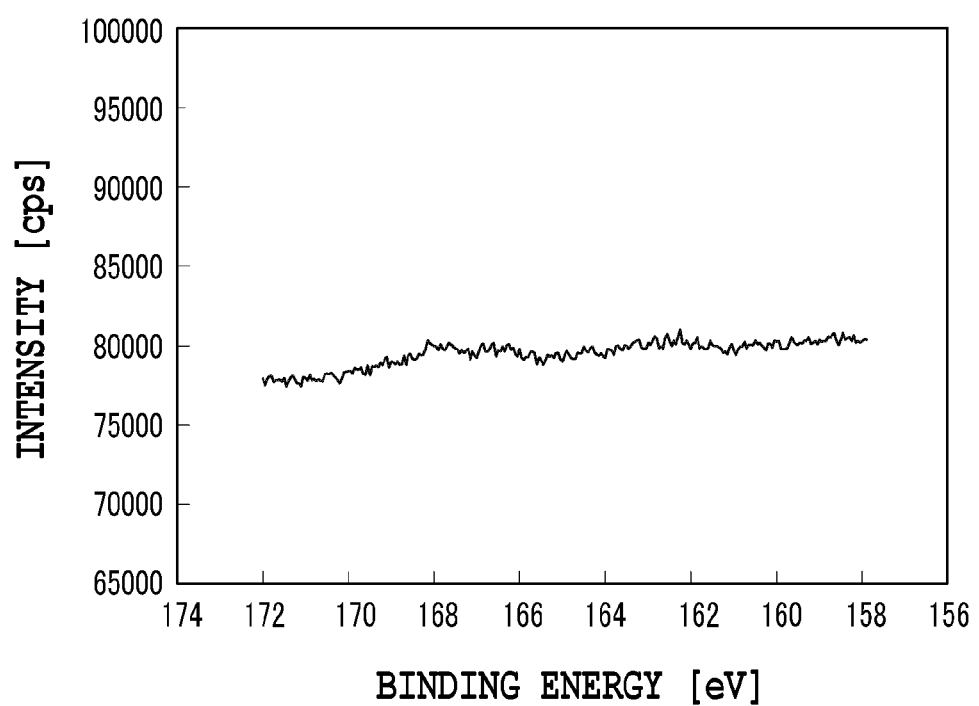
FIG. 5B is a graph showing a photoelectron peak within a S2p region in an X-ray photoelectron spectrum of a surface of a platinum catalyst electrode surface-treated with sodium sulfate.

(9) Note that even when the catalyst electrode is surface-treated using dimethyl sulfoxide having an oxidation number of +2, sodium sulfite ($Na_2SO_3$) having an oxidation number of +4, or sodium sulfate ($Na_2SO_4$) having an oxidation number of +6 according to the procedure (1) i. of the platinum dissolution test in Examples, a photoelectron peak is not observed within the binding energy range of 161 to 165 eV in the X-ray photoelectron spectrum of the surface of the surface-treated catalyst electrode (see FIGS. 3B, 5A, and 5B), and the effects of the present invention are not obtained, either (see test numbers 16, 19, and 20 in Table 1). Presumably, these compounds are not reduced to sulfur in a low oxidation state (having an oxidation number of −2 to 0) on the surface of the catalyst electrode; hence, the effects of the present invention are not demonstrated.

(10) In the present invention, the sulfur material (a) has a molecular weight of 32 to 10,000, but has a low molecular weight of preferably 32 to 5,000, more preferably 32 to 1,000, and further preferably 32 to 500. Hence, n-conjugated conductive polymers and conductive binders such as polypyrrole, polyaniline, and polythiophene as described in PTLs 1 and 4 are excluded.

Generally, a polymer forms a three-dimensional film structure. Accordingly, it is thought that a polymer film formed on a catalyst completely masks the highly active surface of the metal catalyst, blocking the contact between the catalyst and the reaction substrate, which may lower the catalyst performance. Meanwhile, a low-molecular-weight single molecular layer or single atomic layer is considerably thin, and accordingly does not block the contact between the catalyst and the substrate; thus, it can be expected that the performance thereof is not lowered.

Moreover, in the present invention, the molecular weight of the sulfur material (b) is not particularly limited, but the sulfur material (b) has a low molecular weight of preferably 32 to 10,000, more preferably 32 to 5,000, further preferably 32 to 1,000, and still further preferably 32 to 500.

2) Catalyst Electrode and Surface Treatment with Particular Sulfur Material (1) The catalyst electrode in the present invention has a catalyst layer made of a platinum group element formed on an electrode substrate.

The platinum group element is Ru, Rh, Pd, Os, Ir, or Pt, more preferably Pt.

The electrode substrate is not particularly limited, as long as it has a corrosion resistance to a corrosive component in an electrolyte layer sealed between the catalyst electrode and a semiconductor electrode. Examples of the electrode substrate include metal materials such as titanium, nickel, and tungsten; conductive glass materials such as FTO (fluorine-doped tin oxide film), ITO (indium tin oxide film), and ATO (antimony tin oxide film); metal oxide materials such as zinc oxide and titanium oxide; and the like. Above all, from the viewpoint of cost and durability, metal materials and conductive glasses are preferably used. More preferable are titanium among metal materials and FTO among conductive glass materials.

Additionally, examples of the platinum group catalyst layer include those formed by: a plating method, a sputtering method, an application of a solution of chloroplatinic acid or the like, a printing method with a paste such as chloroplatinic acid, and other methods. Particularly, for use in a small test cell, one prepared by a sputtering method capable of forming a uniform film is preferably used. In a case of a large module requiring patterning such as a submodule, a film is preferably formed by a screen printing method.

(2) Examples of the surface treatment on the catalyst electrode with the sulfur material include (i) treatments (such as coating, immersing, or exposure to a gaseous sulfur material in a case where the sulfur material is in a gaseous form) on the catalyst electrode with a prepared solution of the sulfur material, and (ii) a method in which when the catalyst electrode layer is prepared on the catalyst electrode, a substrate is treated with the sulfur material together with the catalyst or a catalyst precursor so that the sulfur material can also be incorporated into the catalyst electrode layer.

More specifically, as an example of the former method (i), the electrode having the catalyst layer formed is immersed for a certain period in a solution containing the sulfur material dissolved (if necessary, subjected to heating), and then the electrode is taken out, washed with a solvent and dried.

As the latter method (ii), more specifically, the following is conceivable: a printing paste in which a platinum group element precursor is mixed with the sulfur material is prepared, printed and sintered on the electrode substrate, and as necessary, subjected to a reduction treatment, or the sulfur material (for example, hydrogen sulfide gas) is allowed to react simultaneously with platinum film formation by a CVD method, thereby forming a catalyst layer containing the sulfur material.

Note that, regarding the conditions of such surface treatments, the processes in the procedure (i) i. of the platinum dissolution test in Examples serve as the standard process requirements. The type of a solvent used here is determined according to the following criteria.

a) Basically, water is used as the solvent.
b) If a solution of a predetermined concentration cannot be prepared due to poor water solubility, 3-methoxypropionitrile is used as the solvent.
c) Furthermore, benzene is used for such poorly soluble substances such as elemental sulfur and carbon disulfide, from which a solution of a predetermined concentration cannot be prepared even using water and 3-methoxypropionitrile.

According to the above criteria, generally, it is assumed that water is used as the solvent for the inorganic sulfur materials, while 3-methoxypropionitrile is used as the solvent for the organic sulfur materials.

Nevertheless, it is considered that the difference in the type of solvent hardly has any influence. Accordingly, even if a solution of a predetermined concentration cannot be prepared using the three types of solvent by any chance, a solvent having the highest possible solubility and having a relatively high boiling point (higher than 85° C.) is preferably selected from among readily available solvents for use from the viewpoint of handling easiness.

3) Electrolyte Layer

The electrolyte layer of the present invention comprises chemical species as a redox couple, a solvent of an electrolyte solution for dissolving these, and an additive as a desired component.

Examples of the chemical species as a redox couple include $I_2/I_3^-$ based or $Br_2/Br_3^-$ based redox system, and the like. An $I_2/I_3^-$ based redox system is preferable. Examples of a counterion thereof include lithium salts, imidazolium salts, other quaternary ammonium salts, and the like. Above all, from the viewpoint of achieving both high performances and excellent durability, imidazolium salts or other quaternary ammonium salts are more preferably used.

As the solvent of an electrolyte solution, it is possible to use any of non-aqueous organic solvents, ambient temperature molten salts, water, protic organic solvents, and the like, as long as electrolytes such as the chemical species as a redox couple can be dissolved sufficiently. non-aqueous organic solvents are preferable examples. Above all, 3-methoxypropionitrile is particularly preferable from the viewpoint of achieving both high performances and excellent durability.

Additionally, the electrolyte solution has a viscosity of preferably 0.35 mPa·s (20° C.) to 695 cPa·s (20° C.), more preferably 0.1 cPa·s (20° C.) to 10 cPa·s (20° C.)

4) Photo-Sensitizing Dye (1) As the photo-sensitizing dye, various metal complexes and organic dyes having an absorption in the visible region and/or the infrared region can be used and are adsorbed to the metal oxide semiconductor film by any known methods, for example, a method in which a thin film of an oxide semiconductor such as titanium dioxide is immersed in a dye solution at a predetermined temperature (a dipping method, a roller method, an air knife method, or the like), or a method in which a dye solution is applied to a surface of an oxide semiconductor layer (a wire bar method, an application method, a spin method, a spray method, an offset printing method, a screen printing method, or the like).

(2) Note that in the present invention, particularly the effects of the present invention are considerably demonstrated especially when a dye used as the photo-sensitizing dye is not a metal complex; or even when a metal complex dye is used as the photo-sensitizing dye, if the metal complex dye thus used does not contain a ligand (thiocyanate ligand or the like) containing a sulfur atom having an oxidation number of −2 to 0.

The reason is as follows. When a metal complex dye is used as the photo-sensitizing dye, if the electrolyte solution contains iodide anions, tert-butylpyridine, or the like, an exchange reaction takes place with the aforementioned ligand of the metal complex. This provides a possibility that the ligand of the metal complex is released into the electrolyte solution. Hence, if a ligand such as a thiocyanate ligand containing a sulfur atom having an oxidation number of −2 to 0 is used as such a ligand, it may contribute to formation of a sulfur coated film on a catalyst electrode to some extent in a mode as described in a second embodiment of the present invention below.

5) As other components of the dye-sensitized solar cell of the present embodiment, those normally used can be used suitably.

(1) Semiconductor Electrode

The semiconductor electrode of the present invention is preferably a translucent electrode and is made of an oxide semiconductor film formed on a transparent conductive substrate. The oxide semiconductor layer supports the spectrally photo-sensitizing dye.

As the oxide semiconductor, it is possible to use known porous materials such as titanium oxide, zinc oxide, tin oxide, tin-doped indium oxide, zirconium oxide, and magnesium oxide, which can be formed on the transparent conductive substrate by a spin coating method, a spray method, a dipping method, a screen printing method, a doctor blade method, an ink-jet method, or the like. A spin coating method, a spray method or a dipping method is preferably employed from the viewpoint of easiness of the operation, while a screen printing method is preferably employed from the viewpoint of mass production.

(2) Transparent Conductive Substrate

As the transparent conductive substrate, it is preferable to use those having, as a transparent conductive film, a film of titanium oxide, zinc oxide (optionally doped with antimony or aluminium), indium oxide (optionally doped with tin or zinc), tin oxide [optionally doped with antimony (ATO), or optionally doped with fluorine (FTO)], or the like formed on a transparent substrate such as a transparent glass or a transparent resin film.

(3) Method for Producing Dye-Sensitized Type Solar Cell

The dye-sensitized type solar cell is produced by bonding the semiconductor electrode and the catalyst electrode together with a sealant in between.

For example, a partition wall of the sealant is formed on the transparent conductive substrate having the semiconductor electrode. The partition wall can be formed easily by using a printing technique such as screen printing. The sealant is not particularly limited, as long as it has a corrosion resistance to a corrosive component in the electrolyte. Examples of the sealant include thermoplastic resins, thermosetting resins, ultraviolet curable resins, electron beam curable resins, metals, rubbers, and the like. At least the surface of the sealant needs to be electrically insulative. If the sealant is electrically conductive, the surface thereof is covered by an electrically insulating material such as various resins and rubbers.

Then, the semiconductor electrode and the catalyst electrode are bonded together with the sealant in between. In this event, attention should be paid in order that the two electrodes may be arranged parallel to each other by uniform application of a pressure.

Further, the partition wall of the sealant keeps a uniform space between the semiconductor electrode and the catalyst electrode, in which the electrolyte is encapsulated. Thus, a dye-sensitized solar cell is produced.

Note that the photo-sensitizing dye can be fixed on the semiconductor electrode by, for example, immersing the semiconductor electrode into a dye solution before or after the bonding step.

2. Second Embodiment of the Present Invention

In the second embodiment of the present invention, a dye-sensitized type solar cell is characterized in that an electrolyte layer contains the following particular sulfur material, that is, (a) at least one sulfur material having a molecular weight of 32 to 10,000 selected from elemental sulfur, inorganic sulfur compounds each containing at least one sulfur atom having an oxidation number of −2 to 0, and organic sulfur compounds each containing at least one sulfur atom having an oxidation number of −2 to 0;

(b) at least one sulfur material containing no sulfur atom having an oxidation number of −2 to 0 selected from inorganic sulfur compounds each containing at least one sulfur atom having an oxidation number of +1 to +4 and organic sulfur compounds each containing at least one sulfur atom having an oxidation number of +1 to +4; or (c) a mixture of the sulfur materials (a) and (b).

Nevertheless, it is required that the sulfur material (b) is such a material that when the catalyst electrode is surface-treated with the sulfur material (b), the treated surface of the catalyst electrode has a photoelectron peak within a binding energy range of 161 to 165 eV in an X-ray photoelectron spectrum.

Moreover, when the sulfur material (a) is a guanidinium thiocyanate, the guanidinium thiocyanate is required to have a concentration of less than 0.1 M in the electrolyte layer, and when the sulfur material (a) is 1-ethyl-3-methylimidazolium thiocyanate, the 1-ethyl-3-methylimidazolium thiocyanate is required to be less than 35% by volume in a solvent of an electrolyte solution.

In the present embodiment, as in the first embodiment of the present invention, the effect of suppressing dissolution of a catalyst and at least in a preferred mode, the effect of improving the catalytic activity can be obtained as well. Conceivably, these effects are derived from the sulfur material added into the electrolyte layer, the sulfur material forming a sulfur coated film on a catalyst layer. In other words, in the first embodiment of the present invention, a catalyst counter electrode may be brought into contact with a sulfur material in advance to form a sulfur coated film directly on a catalyst layer, while in the present embodiment, a sulfur coated film can be also formed on a catalyst layer as time elapses by incorporating a sulfur material into an electrolyte layer.

Further, in the case of the present embodiment, the sulfur material in the electrolyte continues to be in contact with the catalyst surface in the cell all the times. Accordingly, it can be expected that the sulfur coated film lasts long.

Note that among modes in which an electrolyte layer contains a sulfur material, a mode in which the sulfur material is present as an additive in a dissolved state in the solvent of the electrolyte solution is typical, but is not always limited thereto, as long as the effects of the present invention are not impaired. For example, it is conceivable that a sulfur material containing a sulfur atom having an oxidation number of +4 such as sulfolane may be used as a solvent of an electrolyte solution, while some of the inorganic sulfur materials may be used as an ionic liquid in a solvent of an electrolyte solution.

1) In the dye-sensitized solar cell of the present embodiment, unlike the first embodiment of the present invention, the catalyst electrode does not always have to be surface-treated with a particular sulfur material, but the electrolyte layer always contains a particular sulfur material. Moreover, there are other differences in consideration of NPLs 2, 3, and 5: when the sulfur material (a) as the particular sulfur material is guanidinium thiocyanate, the guanidinium thiocyanate has a concentration of less than 0.1 Min the electrolyte layer; and when the sulfur material (a) is 1-ethyl-3-methylimidazolium thiocyanate, the 1-ethyl-3-methylimidazolium thiocyanate is less than 35% by volume in the electrolyte layer.

Nonetheless, as to points other than such differences, basically the description of the first embodiment of the present invention is applied appropriately to the dye-sensitized type solar cell of the present embodiment as well.

2) Particular Sulfur Material in the Electrolyte Layer (1) The particular sulfur material of the present embodiment is basically the same particular sulfur material used in the first embodiment of the present invention.

Nonetheless, NPLs 2 and 3 disclose an example where the minimum amount of guanidinium thiocyanate used in an electrolyte solution of a dye-sensitized solar cell is 0.1 M. NPL 5 discloses an example where 1-ethyl-3-methylimidazolium thiocyanate is used as a solvent of an electrolyte solution, which is a cosolvent with 1-propyl-3-methylimidazolium iodide at a volume ratio of 7:13 (1-ethyl-3-methylimidazolium thiocyanate:1-propyl-3-methylimidazolium iodide) in an electrolyte solution of a dye-sensitized solar cell. Hence, the particular sulfur material of the present embodiment differs from the first embodiment of the present invention in that: when guanidinium thiocyanate is used as the sulfur material, the guanidinium thiocyanate has a molar concentration of less than 0.1 M, preferably 0.05 M or less, in the electrolyte layers; in addition, when 1-ethyl-3-methylimidazolium thiocyanate is used as the sulfur material, the 1-ethyl-3-methylimidazolium thiocyanate has a volume percent of less than 35% by volume, preferably 20% by volume or less, more preferably 10% by volume or less, and further preferably 5% by volume or less, in the solvent of the electrolyte solution.

Note that the "volume percent" of the 1-ethyl-3-methylimidazolium thiocyanate in the solvent of the electrolyte solution is calculated as follows. Specifically, the volume percent of the 1-ethyl-3-methylimidazolium thiocyanate is calculated based on a sum of volumes of a main solvent and one or more cosolvents. The main solvent is a liquid component present in the largest amount (based on the volume of the component present alone) among components in a liquid state at standard ambient temperature and pressure (25° C., 1 atm) of the electrolyte layer. The one or more cosolvents are 1-ethyl-3-methylimidazolium thiocyanate (ionic liquid) and one or more optional liquid components, each of the optional liquid component having a one-fifth volume or more of the main solvent (based on the volumes of the components each present alone).

Nonetheless, NPL 2 merely states that guanidinium cations added into an electrolyte solution suppress charge recombination and shift the band edge of titania to thereby improve the open-circuit voltage Voc, but does not mention the effect of thiocyanate anion. Moreover, NPL 3 also reports that: guanidinium thiocyanate positively shifts the flatband potential of titania to thereby increase the electron injection efficiency and improve the short-circuit current density Jsc; and guanidinium cation chemisorbed on titania passivates the recombination sites on titania. However, NPL 3 does not mention the effect of thiocyanate anion itself. Further, NPL 5 does not necessarily describe the effect of preventing elution of a catalyst from a catalyst electrode particularly by 1-ethyl-3-methylimidazolium thiocyanate.

Meanwhile, the sulfur material of the present embodiment is preferably a sulfur material which is not only simply distributed uniformly and undynamically in the electrolyte layer but is likely to diffuse dynamically. More specifically, the sulfur material is preferably dispersed, further preferably dissolved, in the electrolyte.

(2) The concentration of the sulfur material in the electrolyte layer is preferably a concentration exceeding at least 0.001 M to obtain the effects of the present invention. If the concentration is 0.01 M or higher, more preferable sufficient effects can be obtained. In addition, a preferable upper limit of the concentration is within the range not impairing the effects of the present invention, and the concentration at the solubility level or lower is preferable.

3. Third Embodiment of the Present Invention (1) The present embodiment basically corresponds to a combinational dye-sensitized solar cell of the first and the second embodiments of the present invention. Accordingly, basically, the descriptions of the first and the second embodiments of the present invention in 1 and 2 above can be applied here.

(2) However, unlike the second embodiment, when a second sulfur material (a2) of the present embodiment is guanidinium thiocyanate, the guanidinium thiocyanate does not always have to have a concentration of less than 0.1 M in an electrolyte layer; moreover, when the second sulfur material (a2) of the present embodiment is 1-ethyl-3-methylimidazolium thiocyanate, the 1-ethyl-3-methylimidazolium thiocyanate does not always have to be less than 35% by volume in the electrolyte layer. This is because NPLs 2, 3, and 5 do not particularly explicitly describe this combinational embodiment of the first and the second embodiments of the present invention.

(3) In addition, in the present embodiment, it is not always necessary to use the same material for: the second sulfur material contained as a particular sulfur material in the electrolyte layer, and a first sulfur material used as a particular sulfur material for the surface treatment on a catalyst electrode.

Moreover, when the second sulfur material used as an additive in the electrolyte layer is guanidinium thiocyanate, the first sulfur material other than guanidinium thiocyanate can be used in combination as the first sulfur material. NPLs 2, 3, and 5 do not describe or suggest such an embodiment at all.

Further, when the second sulfur material used as a solvent of an electrolyte solution in the electrolyte layer is 1-ethyl-3-methylimidazolium thiocyanate, the first sulfur material other than 1-ethyl-3-methylimidazolium thiocyanate can be used in combination as the first sulfur material. NPLs 2, 3, and 5 do not describe or suggest such an embodiment at all.

(4) The present embodiment is preferable in that the effects of the present invention can be further effectively demonstrated in comparison with other embodiments of the present invention: the first and the second embodiments.

Specifically, in the case of the second embodiment of the present invention alone, it is considered to take some time to form the sulfur coated film on the catalyst layer. Nevertheless, if the first embodiment of the present invention is employed in combination, the effect of suppressing dissolution of a catalyst and at least in a preferred mode, the effect of improving the catalytic activity can be obtained immediately after a cell is produced.

Moreover, in comparison with the first embodiment of the present invention, it is also possible to complement the dissolution-suppressing effect with a long-lasting improvement of the sulfur coated film, and the effect of improving the catalytic activity at least in a preferred mode with a long-lasting effect thereof, which are advantages of the present embodiment.

Further, the present embodiment has an advantage that more sulfur materials are allowed to exist (total of those on the surface of the catalyst electrode and in the electrolyte layer) than in the first and the second embodiments of the present invention.

4. Fourth Embodiment of the Present Invention (1) The present embodiment generalizes the dye-sensitized solar cells of the first to the third embodiments of the present invention as a method for preventing elution of a platinum group catalyst.

Thus, basically, the descriptions of the first to the third embodiments of the present invention in the sections 1, 2, and 3 above can be applied here.

(2) Nonetheless, in the present embodiment specifying the method for preventing elution of a platinum group catalyst, when an electrolyte layer contains the above-described particular sulfur material, unlike the second embodiment of the present invention, if a second sulfur material (a2) is guanidinium thiocyanate in the present embodiment, the guanidinium thiocyanate does not always have to have a concentration of less than 0.1 M in the electrolyte layer; moreover, when the second sulfur material (a2) is 1-ethyl-3-methylimidazolium thiocyanate in the present embodiment, the 1-ethyl-3-methylimidazolium thiocyanate does not always have to be less than 35% by volume in the electrolyte layer. This is because NPLs 2, 3, and 5 above neither describe nor suggest at all the effect of preventing elution of a platinum group catalyst by using guanidinium thiocyanate or 1-ethyl-3-methylimidazolium thiocyanate in an electrolyte layer.

(3) In the present embodiment, when a first sulfur material and a second sulfur material are used in combination, it is not always necessary to use the same material for: the second sulfur material contained as a particular sulfur material in the electrolyte layer, and the first sulfur material used as a particular sulfur material for the surface treatment on a catalyst electrode.

EXAMPLES

[Platinum Dissolution Test]

(1) According to the following procedures i. to vi., titanium plates on which platinum was vapor-deposited were treated with various sulfur materials. Then, percentages of retained platinum were measured. Table 1 shows the result.

i. A titanium plate on which 10-nm platinum was vapor-deposited by sputtering was immersed into a solution in which a sulfur material was dissolved in a solvent (concentration: 0.1 M), followed by heating at 85° C. (70° C. in a case where benzene was used as the solvent) for 1 hour, and by washing with the solvent containing no sulfur material to prepare a test piece.

ii. Platinum of the test piece was quantified using an energy dispersive X-ray fluorescence spectrometer (EDX900 manufactured by Shimadzu Corporation). The Lα radiation intensity (9.44 keV) of platinum at this time was designated as $I_{Pt0}$.

iii. The test piece was immersed into an electrolyte solution (prepared by dissolving 0.1 M iodine, 0.8 M 1-propyl-3-methylimidazolium iodide, and 0.3M tert-butylpyridine in 3-methoxypropionitrile), and placed and kept in a drier at 85° C. for 16 hours.

iv. The immersed test piece was taken out from the drier. Using ethanol, the test piece was washed and dried.

v. Again, platinum was quantified by X-ray fluorescence analysis. The Lα radiation intensity (9.44 keV) of platinum at this time was designated as $I_{Pt1}$.

vi. The percentage of retained platinum was calculated according to the following formula. Those having the percentage of retained platinum of 90% or higher, 20% or higher but lower than 90%, and lower than 20% were respectively evaluated as "A", "B", and "C". Nevertheless, no test piece among test numbers 1 to 23 listed in Table 1 was evaluated as "B".

Percentage of retained platinum (%)=$(I_{Pt1}/I_{Pt0})\times 100$

TABLE 1

| Test number | Sulfur material | Oxidation number of sulfur atom in sulfur material | Solvent | Treatment temperature (° C.) | Percentage of retained platinum (%) |
|---|---|---|---|---|---|
| 1 | sodium sulfide | −2 | water | 85 | A |
| 2 | 1-dodecanethiol | −1 | 3-methoxypropionitrile | 85 | A |
| 3 | 2,4,6-trimercapto-s-triazine mono sodium salt | −1 | water | 85 | A |
| 4 | guanidinium thiocyanate | 0 | water | 85 | A |
| 5 | potassium thiocyanate | 0 | water | 85 | A |
| 6 | cyclohexyl isothiocyanate | 0 | 3-methoxypropionitrile | 85 | A |
| 7 | rhodanine | 0, 0 | 3-methoxypropionitrile | 85 | A |
| 8 | ethyl rhodanine | 0, 0 | 3-methoxypropionitrile | 85 | A |
| 9 | thiourea | 0 | water | 85 | A |
| 10 | benzothiazole | 0 | 3-methoxypropionitrile | 85 | A |
| 11 | methionine | 0 | water | 85 | A |
| 12 | thiophene | 0 | water | 85 | A |
| 13 | sulfur | 0 | benzene | 70 | A |

TABLE 1-continued

| Test number | Sulfur material | Oxidation number of sulfur atom in sulfur material | Solvent | Treatment temperature (° C.) | Percentage of retained platinum (%) |
|---|---|---|---|---|---|
| 14 | carbon disulfide | 0 | benzene | 70 | A |
| 15 | sodium thiosulfate | 0, +4 | water | 85 | A |
| 16 | dimethyl sulfoxide | +2 | 3-methoxypropionitrile | 85 | C |
| 17 | sodium dithionite | +3 | water | 85 | A |
| 18 | sulfolane | +4 | water | 85 | A |
| 19 | sodium sulfite | +4 | water | 85 | C |
| 20 | sodium sulfate | +6 | water | 85 | C |
| 21 | benzoxazole | — | 3-methoxypropionitrile | 85 | C |
| 22 | n-hexyl isocyanate | — | 3-methoxypropionitrile | 85 | C |
| 23 | No pretreatment | — | — | — | C |

Note that at the stage of the procedure ii., that is, at the stage immediately after the pretreatment with the sulfur material, the test pieces were subjected to X-ray photoelectron spectrometry (S2p region, with AXIS-His manufactured by KRATOS ANALYTICAL).

As a result, in the test numbers 1, 5, 9, 13, 15, 17, and 18, a photoelectron peak was observed within a binding energy range of 161 to 165 eV, which indicates that a sulfur coated film was formed on platinum. On the other hand, in the test pieces of the test numbers 16, 19, and 20, a photoelectron peak was not observed within the range of 161 to 165 eV. Nevertheless, in the test numbers 16 and 19, a photoelectron peak was observed within a range of 165 to 169 eV.

Normally, in an X-ray photoelectron spectrometry, the higher the oxidation state of an atom, the more the binding energy shifts to the high energy side. Taking this into consideration, it is assumed that the peak within 161 to 165 eV indicates sulfur in a low oxidation state (thiolate species, thiol species, or sulfide species having an oxidation number of −2 to 0), and that the peak within 165 to 169 eV indicates sulfur in a higher oxidation state.

Presumably, the fact that the test numbers 1, 5, 9, 13, 15, 17, and 18 demonstrated a high percentage of retained platinum indicates that sulfur in a low oxidation state (thiolate species, thiol species, or sulfide species having an oxidation number of −2 to 0) adsorbed on platinum suppresses elution of the platinum catalyst in the electrolyte solution.

[Dye-sensitized Solar Cell Experiment]

(1) According to the following procedures, dye-sensitized solar cells were produced.

i. A titanium oxide paste [PST-21NR manufactured by Catalysts & Chemicals Industries Co., Ltd.] was screen-printed to a film thickness of 8 μm on a squared area having a side of 1 cm of a substrate (glass plate with a fluorine-doped tin oxide film, 30 mm×25 mm). After drying, a titanium oxide paste [PST-400C manufactured by Catalysts & Chemicals Industries Co., Ltd.] was further screen-printed thereon to a film thickness of 4 μm. By sintering this at 500° C., a power generating layer was formed.

ii. An electrode having the power generating layer formed was immersed into a dye solution [dye: MK-2 manufactured by Soken Chemical & Engineering Co., Ltd., concentration: 0.45 M, solvent: toluene] at 40° C. for 3 hours to thereby support the dye on titanium oxide of the power generating layer. Thus, an anode electrode was obtained.

Note that the dye MK-2 is not a metal complex but a dye having the following structure.

[Chemical formula 13]

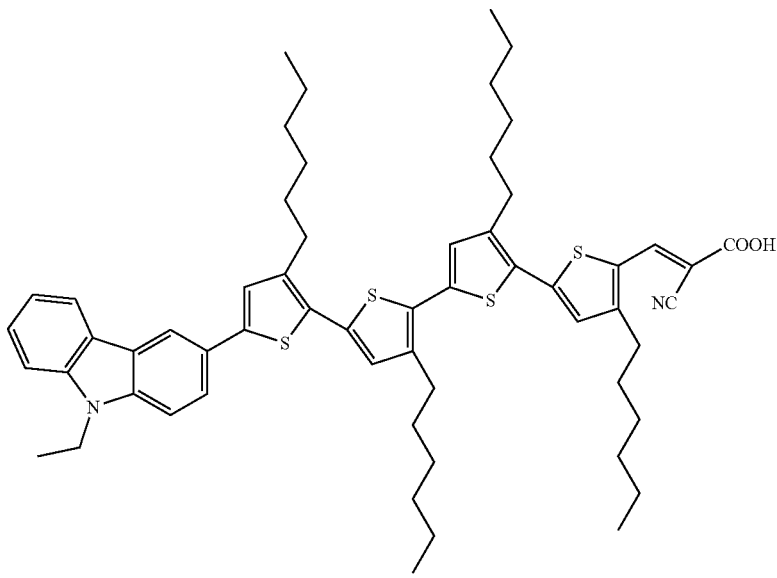

Note that although this dye also contains a sulfur atom having an oxidation number of 0, the dye is a non-complex dye and hardly influences the effects of the invention of the present application, unlike a system such a metal complex dye by which ligand exchange readily occurs.

iii. A hot melt adhesive was applied around the power generating layer of the anode electrode. This anode electrode was adhered to a separately-prepared 10-nm platinum-sputtered titanium plate (cathode electrode) having an electrolyte solution injection hole with the adhesive in such a manner that the two electrodes are arranged parallel to each other with a uniform space of approximately 50 µm in between.

Here, the 10-nm platinum-sputtered titanium plate used in Examples had been immersed in an aqueous solution containing 0.1 M sulfur material, heated at 85° C. for 1 hour, then washed with water and dried. The 10-nm platinum-sputtered titanium plate used in Comparative Example had not been subjected to such a sulfur material treatment.

iv. Then, an electrolyte solution was injected through the electrolyte solution injection hole. The electrolyte solution used here was the following electrolyte solution A or electrolyte solution B.

Electrolyte solution A: a solution of 0.1 M iodine, 0.8 M 1-propyl-3-methylimidazolium iodide, and 0.5 M 1-methyl-benzimidazole in 3-methoxypropionitrile as a solvent.

Electrolyte solution B: a solution of 0.1 M iodine, 0.8 M 1-propyl-3-methylimidazolium iodide, 0.5 M 1-methylbenzimidazole, and 0.01 M cyclohexyl isothiocyanate with 3-methoxypropionitrile as a solvent.

v. The electrolyte solution injection hole was sealed with an adhesive, and a solder for terminal formation was applied onto the anode electrode. Thus, an experimental cell was completed.

(2) The performances, photoelectric conversion efficiency and series resistance, of each dye-sensitized solar cell obtained as described above were evaluated using a solar simulator (YSS-200 manufactured by Yamashita Denso Corporation, AM 1.5, 1 SUN (100 mW/cm$^2$), and the result as shown in the following table was obtained.

with a sulfur material, the catalytic activity was improved, and the initial series resistance was decreased. As a result, a high initial conversion efficiency was obtained. Further, after 4 days elapsed at 85° C. also, no large increase in the series resistance was observed. It can be understood that dissolution of the catalyst platinum was suppressed.

Meanwhile, in a case as in Example 4 where no pretreatment with a sulfur material was performed, this resulted in a high resistance initially in comparison with Examples 1, 2, 3, and 5; however, as 4 days elapsed, the resistance value was decreased. This decrease in the resistance value indicates not only that the catalyst platinum was not dissolved, but also presumably the sulfur material (cyclohexyl isothiocyanate) added into the electrolyte solution B formed a sulfur coated film in a low oxidation state (having an oxidation number of −2 to 0) on the catalyst platinum and improved the catalytic activity.

As described above, it is clear that the present technique is essential for dye-sensitized solar cells to obtain a practical durability.

The invention claimed is:

1. A dye-sensitized solar cell wherein the dye-sensitized solar cell is a dye-sensitized type solar cell comprising:
   a semiconductor electrode containing a photo-sensitizing dye;
   an electrolyte layer containing chemical species as a redox couple; and
   a counter electrode disposed opposite to the semiconductor electrode with the electrolyte layer interposed therebetween,
   the counter electrode is a catalyst electrode containing a platinum group,
   the electrolyte layer contains the chemical species as the redox couple, a solvent of an electrolyte solution for dissolving these, and an optional additive, and
   the electrolyte layer contains in the electrolyte layer any one of sulfur materials as either: the solvent present in an amount sufficient to dissolve the chemical species as the redox couple, or the additive in a dissolved state:

TABLE 2

|  | Sulfur material for pretreatment*1 | Electrolyte | initial photoelectric conversion efficiency*2 | initial series resistance *2, *4 | photoelectric conversion efficiency after 4 days*2 | series resistance after 4 days*2, *4 | percentage of conversion efficiency maintained*3 (%) |
|---|---|---|---|---|---|---|---|
| Example 1 | potassium thiocyanate | A | 5.86 | 7.6 | 5.07 | 7.9 | 87 |
| Example 2 | sodium sulfide | A | 5.82 | 7.5 | 4.92 | 8.0 | 85 |
| Example 3 | thiourea | A | 5.90 | 7.5 | 5.09 | 7.9 | 86 |
| Example 4 | — | B | 5.45 | 10.1 | 4.84 | 8.3 | 89 |
| Example 5 | thiourea | B | 5.79 | 7.5 | 5.08 | 7.7 | 88 |
| Comparative Example | — | A | 5.45 | 10.2 | 1.58 | 68.3 | 29 |

*1: See Table 1 for the process condition of each sulfur material for pretreatment.
*2: The performances measured immediately after completion of the experimental cell were initial photoelectric conversion efficiency and the initial series resistance. After these measurements, the experimental cell was furthe stored in a drier at 85° C. for 4 days. After that, the cell was taken out and cooled to room temperature. Then, the performances measured were photoelectric conversion efficiency after 4 days and series resistance after 4 days.
*3: The percentage pf conversion efficiency maintained in Table 2 was obtained according to the following formula: Percentage of conversion efficiency maintained (%) = 100 × [(photoelectric conversion efficiency after 4 days)/(initial photoelectric conversion effiency)]. Moreover, the photoelectric conversion efficiency was calculated according to the following formula: Photoelectric conversion efficiency (%) = 100 × [(shor-circuit current density × open-circuit voltage × fill factor)/(irradiated solar light energy)].
*4: The series resistance here is calculated according to the following formula: Series resistance (Ω) = (−1)/K, where K in the formula represents a slope of a tangent line at a point crossing the voltage axis (open-circuit voltage point) of a current-voltage curve for the solar cell. The series resistance thus obtained represents the series component of the internal resistance in the dye-sensitized solar cell. Since this series resistance includes a reaction resistance on the catalyst, when the catalyst performance is high, the series resistance shows a relatively low value.

As apparent from Table 2 above, in a case as in Examples 1, 2, 3, and 5 where the catalyst electrode used was pretreated (a) at least one sulfur material having a molecular weight of 32 to 10,000 selected from elemental sulfur, inorganic sulfur compounds each containing at least one sulfur atom having an oxidation number of −2 to 0, and organic sulfur compounds each containing at least one sulfur atom having an oxidation number of −2 to 0;
(b) at least one sulfur material containing no sulfur atom having an oxidation number of −2 to 0 selected from inorganic sulfur compounds each containing at least one sulfur atom having an oxidation number of +1 to +4 and organic sulfur compounds each containing at least one sulfur atom having an oxidation number of +1 to +4; and
(c) a mixture of the sulfur materials (a) and (b), with the proviso that the sulfur material (b) is such a material that when the catalyst electrode is surface-treated with the sulfur material (b), the treated surface of the catalyst electrode has a photoelectron peak within a binding energy range of 161 to 165 eV in an X-ray photoelectron spectrum, when the sulfur material (a) is guanidinium thiocyanate, a concentration of the guanidinium thiocyanate is less than 0.1 M in the electrolyte layer, and when the sulfur material (a) is 1-ethyl-3-methylimidazolium thiocyanate, a volume percent of the 1-ethyl-3-methylimidazolium thiocyanate is less than 35% by volume in the solvent of the electrolyte solution, and when the sulfur material (b) is a sulfone compound as the sulfur material containing a sulfur atom having an oxidation number of +4, the sulfone compound is used as the additive present in a dissolved state in the solvent of the electrolyte solution in the electrolyte layer but not used as the solvent of the electrolyte solution present in an amount sufficient to dissolve the chemical species as the redox couple, where the volume percent of the 1-ethyl-3-methylimidazolium thiocyanate is calculated based on a sum of volumes of a main solvent and one or more cosolvents
where
the main solvent is a liquid component present in a largest amount (based on the volume of the component present alone) among components in a liquid state at standard ambient temperature and pressure (25° C., 1 atm) of the electrolyte layer, and
the one or more cosolvents are 1-ethyl-3-methylimidazolium thiocyanate (ionic liquid) and one or more optional liquid components, each of the optional liquid components having a one-fifth volume or more of the main solvent (based on the volumes of the components each present alone).

2. The dye-sensitized solar cell according to claim 1, wherein
the sulfur material (a) of claim 1 is at least one sulfur material having a molecular weight of 32 to 10,000 selected from:
(i) elemental sulfur, metal sulfide salts, metal salts of hydrogen sulfide, ammonium sulfide, primary to quaternary ammonium sulfides, ammonium hydrogen sulfide, primary to quaternary ammonium hydrogen sulfides, hydrogen sulfide, and carbon sulfide,
(ii) organic sulfur compounds having one or more sulfur functional groups selected from a thiol group [—SH] and salts thereof, a hydropolysulfide group [—(S)$_n$SH, where n is an integer of greater than or equal to 1] and salts thereof, a sulfide group [—S—], a polysulfide group [—(S)$_n$S—, where n is an integer of greater than or equal to 1], a thiocarbonyl group [—C(=S)—], a thioaldehyde group [—C(=S)H], a thiocarboxyl group [—C(=S)OH or —C(=O)SH] and salts, esters, amides, imides, acid anhydrides, and acid halides thereof, a dithiocarboxylic acid [—C(=S)SH] and salts and esters thereof, a thioacetal group, and a thioketal group,
(iii) thiocyanic acid, salts and esters thereof, and isothiocyanic acid esters,
(iv) thioureas, isothioureas, dithiocarbamic acids, and salts and esters thereof,
(v) substituted or unsubstituted thiophenes, and substituted or unsubstituted thiazoles, and
(vi) thiosulfuric acid, and salts and esters thereof, and
the sulfur material (b) of claim 1 is at least one sulfur material selected from:
(vii) dithionous acid and salts thereof, and
(viii) sulfone compounds.

3. The dye-sensitized type solar cell according to claim 1, wherein the chemical species in the electrolyte layer are an $I_2/I_3^-$ based redox couple.

4. The dye-sensitized type solar cell according to claim 1, wherein the photo-sensitizing dye is
a dye which is not a metal complex dye, or
a metal complex dye which does not have a ligand containing a sulfur atom having an oxidation number of −2 to 0.

* * * * *